(12) United States Patent  
Yasuda et al.

(10) Patent No.: US 12,278,320 B2  
(45) Date of Patent: Apr. 15, 2025

(54) LIGHT EMITTING DEVICE AND MANUFACTURING METHOD THEREFOR

(71) Applicant: STANLEY ELECTRIC CO., LTD., Tokyo (JP)

(72) Inventors: Yoshiaki Yasuda, Tokyo (JP); Hirofumi Chiba, Tokyo (JP); Mitsuyasu Kumagai, Tokyo (JP); Yukio Suzuki, Miyagi (JP); Shuji Tanaka, Miyagi (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 579 days.

(21) Appl. No.: 17/615,009

(22) PCT Filed: May 13, 2020

(86) PCT No.: PCT/JP2020/019134  
§ 371 (c)(1),  
(2) Date: Nov. 29, 2021

(87) PCT Pub. No.: WO2020/241261  
PCT Pub. Date: Dec. 3, 2020

(65) Prior Publication Data  
US 2022/0231212 A1 Jul. 21, 2022

(30) Foreign Application Priority Data  
May 30, 2019 (JP) .................................. 2019-100973

(51) Int. Cl.  
*H01L 33/64* (2010.01)  
*H01L 23/00* (2006.01)  
(Continued)

(52) U.S. Cl.  
CPC ............ *H01L 33/647* (2013.01); *H01L 24/05* (2013.01); *H01L 24/06* (2013.01); *H01L 24/29* (2013.01);  
(Continued)

(58) Field of Classification Search  
CPC ..... H01L 33/647; H01L 33/486; H01L 33/60; H01L 33/62; H01L 33/32;  
(Continued)

(56) References Cited

U.S. PATENT DOCUMENTS 5,448,114 A * 9/1995 Kondoh ................ H01L 21/563  
257/781  
7,528,422 B2 5/2009 Murphy  
(Continued)

FOREIGN PATENT DOCUMENTS

CN 102593100 A 7/2012  
CN 109690796 A 4/2019  
(Continued)

OTHER PUBLICATIONS

International Search Report (ISR) (and English translation thereof) dated Aug. 4, 2020 issued in International Application No. PCT/JP2020/019134.  
(Continued)

*Primary Examiner* — Galina G Yushina  
(74) *Attorney, Agent, or Firm* — Holtz, Holtz & Volek PC

(57) ABSTRACT

In a light emitting device, in a bottom surface of a cavity of a Si substrate, slit-shaped through holes and through electrodes that fill the through holes are provided at a position facing a first element electrode of a light emitting element. A length of an upper surface of the through electrode in a long axis direction is larger than a height of the through electrode in a thickness direction of the Si substrate. A joining layer having a shape corresponding to a shape of the (Continued)

upper surface of the through electrode is disposed between the first element electrode of the light emitting element and the upper surface of the through electrode facing the first element electrode. The entire upper surface of the through electrode is joined to the first element electrode via the joining layer.

24 Claims, 12 Drawing Sheets

(51) Int. Cl.
    *H01L 33/32*     (2010.01)
    *H01L 33/48*     (2010.01)
    *H01L 33/60*     (2010.01)
    *H01L 33/62*     (2010.01)
    *H01S 5/02*     (2006.01)
    *H01S 5/042*     (2006.01)
    *H01S 5/183*     (2006.01)

(52) U.S. Cl.
    CPC .............. *H01L 24/32* (2013.01); *H01L 24/83* (2013.01); *H01L 33/486* (2013.01); *H01L 33/60* (2013.01); *H01L 33/62* (2013.01); *H01L 24/30* (2013.01); *H01L 24/33* (2013.01); *H01L 33/32* (2013.01); *H01L 2224/0557* (2013.01); *H01L 2224/05571* (2013.01); *H01L 2224/05655* (2013.01); *H01L 2224/06132* (2013.01); *H01L 2224/29013* (2013.01); *H01L 2224/29023* (2013.01); *H01L 2224/29111* (2013.01); *H01L 2224/29144* (2013.01); *H01L 2224/30505* (2013.01); *H01L 2224/30517* (2013.01); *H01L 2224/32014* (2013.01); *H01L 2224/32111* (2013.01); *H01L 2224/32145* (2013.01); *H01L 2224/32225* (2013.01); *H01L 2224/33106* (2013.01); *H01L 2224/83815* (2013.01); *H01L 2224/8383* (2013.01); *H01L 2924/01322* (2013.01); *H01L 2924/12041* (2013.01); *H01L 2933/0066* (2013.01); *H01L 2933/0075* (2013.01); *H01S 5/021* (2013.01); *H01S 5/04256* (2019.08); *H01S 5/183* (2013.01)

(58) Field of Classification Search
    CPC ... H01L 2224/0557; H01L 2224/05571; H01L 24/06; H01L 24/05; H01L 24/29; H01L 24/32; H01L 24/83; H01L 24/33; H01L 2224/05655; H01L 2224/06132; H01S 5/042; H01S 5/02; H01S 5/183
    See application file for complete search history.

(56) References Cited

U.S. PATENT DOCUMENTS

| | | |
|---|---|---|
| 7,582,496 B2 | 9/2009 | Lee et al. |
| 7,981,798 B2* | 7/2011 | Taguchi .............. B81C 1/00301 |
| | | 438/668 |
| 9,818,923 B2 | 11/2017 | Ueda et al. |
| 2002/0093023 A1* | 7/2002 | Camras ................... H01L 33/20 |
| | | 257/E33.07 |
| 2004/0052480 A1* | 3/2004 | Benzoni ............... G02B 6/4279 |
| | | 385/94 |
| 2006/0214178 A1 | 9/2006 | Choi et al. |
| 2009/0273002 A1* | 11/2009 | Chiou ................... H01L 33/486 |
| | | 257/E33.058 |
| 2011/0241061 A1* | 10/2011 | Yu ..................... H01L 21/76876 |
| | | 257/E33.056 |
| 2012/0161190 A1* | 6/2012 | Yao ..................... H01L 23/3677 |
| | | 257/E21.597 |
| 2012/0168206 A1 | 7/2012 | Sekine et al. |
| 2013/0006565 A1* | 1/2013 | Matsumoto ............. H01L 22/12 |
| | | 702/82 |
| 2016/0003435 A1* | 1/2016 | Yasuda ................... F21S 41/29 |
| | | 362/520 |
| 2016/0271728 A1* | 9/2016 | Dai ........................ H01M 4/382 |
| 2016/0285232 A1* | 9/2016 | Reinert ................. H01S 5/4025 |
| 2017/0276160 A1* | 9/2017 | Sadr .......................... F16L 9/17 |
| 2019/0189862 A1 | 6/2019 | Ichinokura et al. |

FOREIGN PATENT DOCUMENTS

| | | |
|---|---|---|
| JP | 2006287188 A | 10/2006 |
| JP | 2009076752 A | 4/2009 |
| JP | 2009524234 A | 6/2009 |
| JP | 2011138953 A | 7/2011 |
| JP | 2016127254 A | 7/2016 |

OTHER PUBLICATIONS

Written Opinion dated Aug. 4, 2020 issued in International Application No. PCT/JP2020/019134.
Extended European Search Report (EESR) dated May 9, 2023, issued in counterpart European Application No. 20815669.5.
International Preliminary Report on Patentability (IPRP) dated Nov. 4, 2021, issued in International Application No. PCT/JP2020/019134.
Indian Office Action dated Apr. 13, 2022, issued in counterpart Indian Application No. 202147054122.
Chinese Office Action (and an English language translation thereof) dated Jul. 8, 2024, issued in counterpart Chinese Application No. 202080036344.1.

\* cited by examiner (a)

(b)

A-A' SECTIONAL VIEW

BOTTOM VIEW (a)

(b)

LIGHT EMITTING DEVICE AND MANUFACTURING METHOD THEREFOR

TECHNICAL FIELD

The present invention relates to a light emitting device in which a light emitting element such as an LED is mounted, and particularly to a light emitting device in which a light emitting element that requires a large current supply such as an LED for emitting ultraviolet light is sealed in a hermetic package.

BACKGROUND ART

Since an LED for emitting ultraviolet light uses an AlGaN semiconductor that is likely to be deteriorated due to humidity for a light emitting layer, it is desired that a package is hermetically sealed. However, a structure in which a resin is filled around a visible light LED to implement the sealing cannot be used for the ultraviolet light LED because the resin is to be deteriorated by the ultraviolet light. Therefore, for example, a structure is used in which an ultraviolet light LED installed on an AlN submount is mounted on a bottom surface of a cavity formed of an AlN ceramic sintered body, and an opening of the cavity is sealed with a quartz plate.

PTL 1 discloses a configuration in which through electrodes formed by penetrating in a thickness direction of a substrate made of AlN are provided, and a die pad for mounting and joining a light emitting element is disposed on the through electrodes and the AlN substrate.

CITATION LIST

Patent Literature

PTL 1: JP-A-2016-127254

SUMMARY OF INVENTION

Technical Problem

In recent years, there has been a demand for LEDs that uniformly emit light with a large light amount and a large area. Therefore, there is a need for a package structure in which a large current can be uniformly supplied to a large area semiconductor layer of an LED, and heat generated by the LED due to supply of the large current is efficiently conducted to an external heat dissipation structure.

In the structure described in PTL 1, through electrodes are used, but no contrivance is provide to uniformly supply a large current to the semiconductor layer and conduct the generated heat to the outside. Specifically, PTL 1 does not disclose a configuration for lowering electrical resistance and increasing thermal conductivity while using through electrodes in which voids are likely to be generated inside at the time of plating filling.

An object of the invention is to provide a light emitting device in which a large current can be uniformly supplied to a large area semiconductor layer of a light emitting element and which has good heat dissipation properties.

Solution to Problem

In order to achieve the above object, a light emitting device of the invention includes: a light emitting element including a semiconductor layer which includes a light emitting layer, and a first element electrode and a second element electrode which are joined to the semiconductor layer and through which a current for causing the light emitting layer to emit light is to be supplied; and a Si substrate provided with a cavity, and the light emitting element is installed on a bottom surface of the cavity. The first element electrode is disposed on a surface of the semiconductor layer which faces the bottom surface of the cavity. In the bottom surface of the cavity of the Si substrate, a slit-shaped through hole and a through electrode that fills the through hole are provided at a position facing the first element electrode of the light emitting element. A length of an upper surface of the through electrode in a long axis direction is larger than a height of the through electrode in a thickness direction of the Si substrate. A joining layer having a shape corresponding to a shape of the upper surface of the through electrode is disposed between the first element electrode of the light emitting element and the upper surface of the through electrode facing the first element electrode. The entire upper surface of the through electrode is joined to the first element electrode via the joining layer.

Advantageous Effect

According to the invention, it is possible to provide a light emitting device in which a large current can be uniformly supplied to a large area semiconductor layer of a light emitting element and which has good heat dissipation properties.

DESCRIPTION OF EMBODIMENTS

A light emitting device according to an embodiment of the invention will be described with reference to the drawings.

Figure 1:
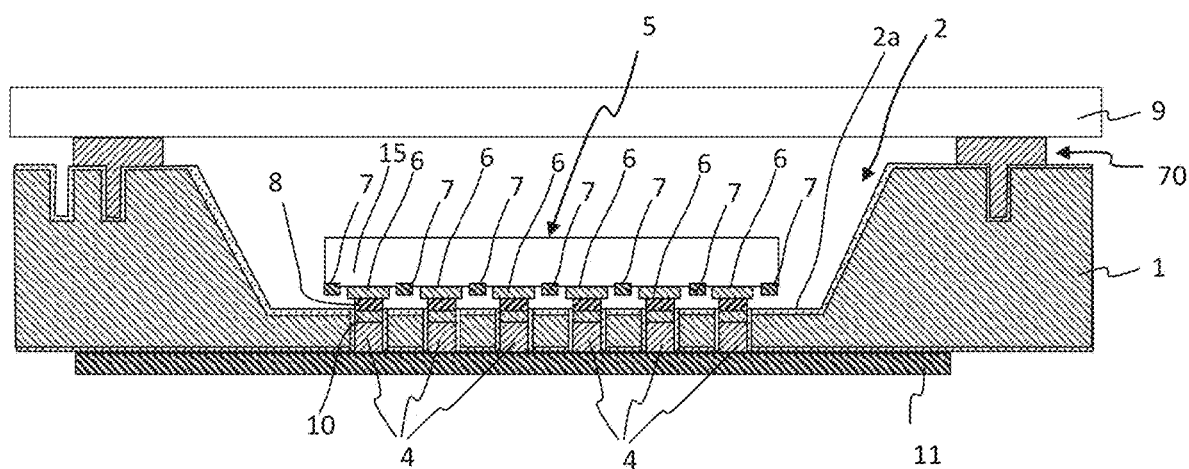
FIG. 1 is a cross-sectional view of a light emitting device according to an embodiment of the invention.
Figure 2:
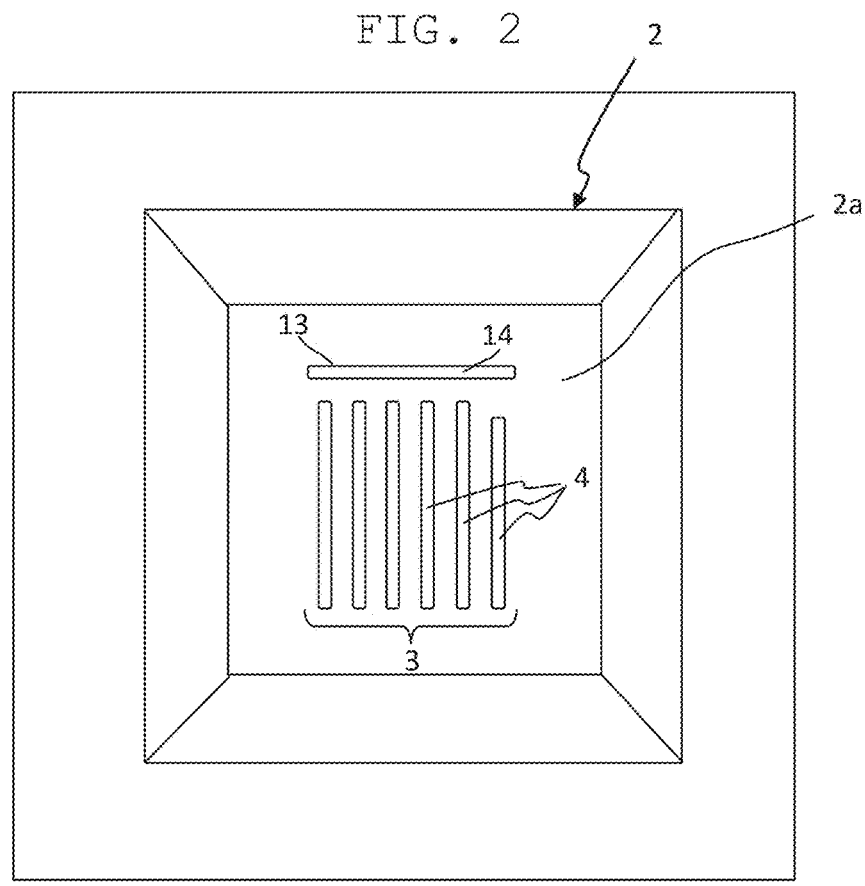
FIG. 2(a) is a top view of a Si substrate 1 of the light emitting device of the embodiment.
FIG. 2(b) is a bottom view of the Si substrate 1.
Figure 2:
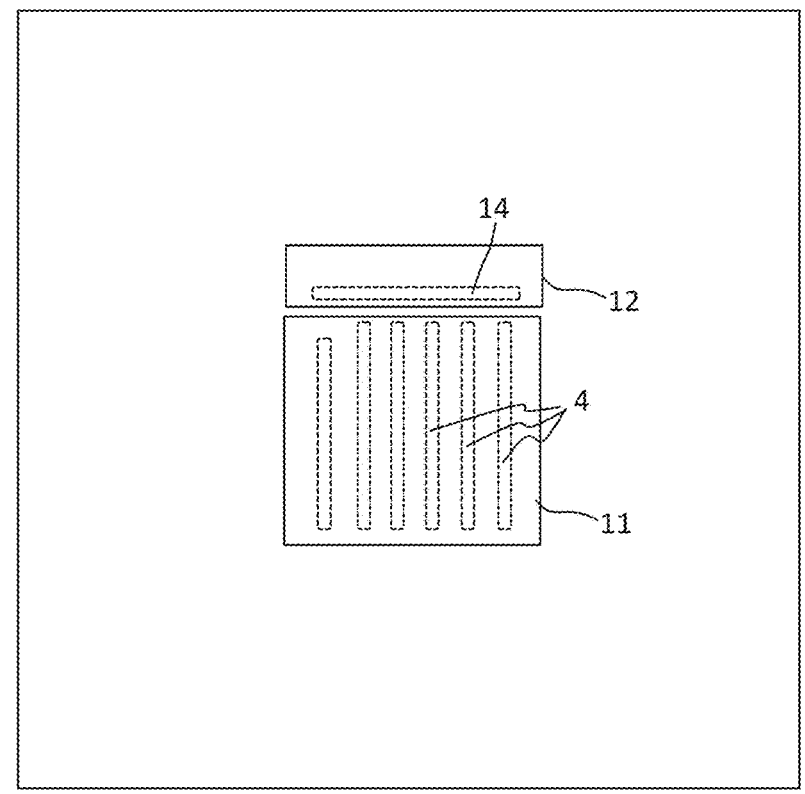
Figure 3:
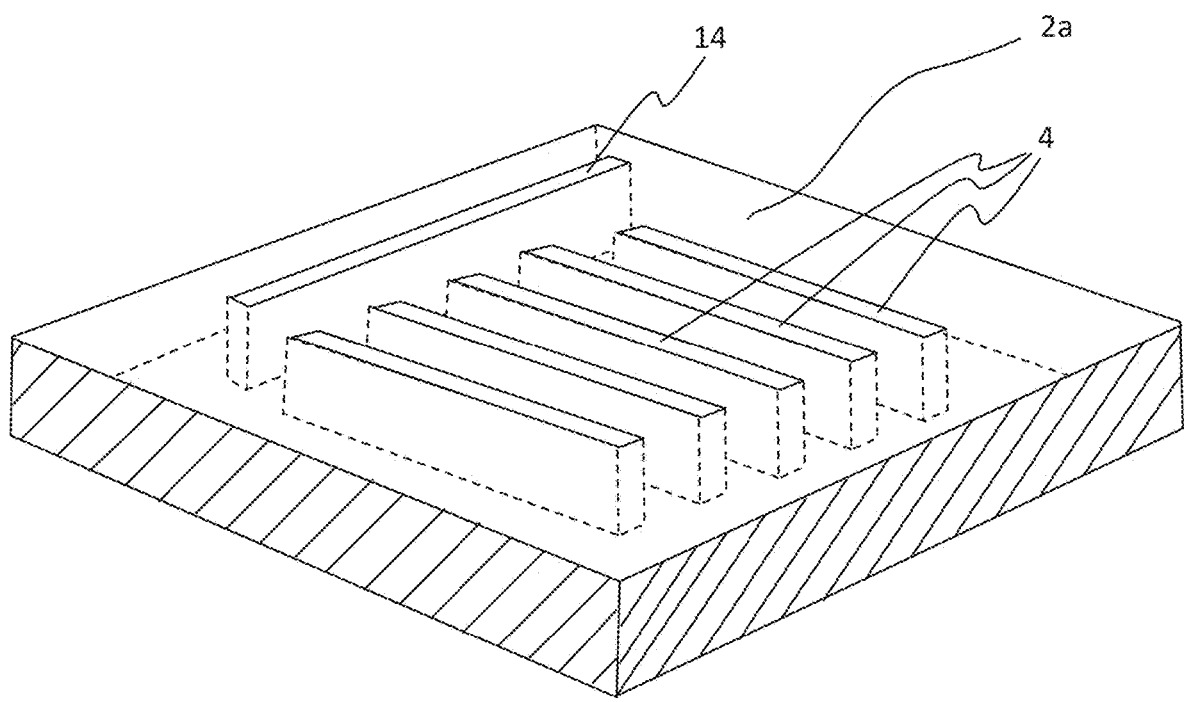
FIG. 3 is a perspective view of a bottom surface region of a cavity 2 of the Si substrate 1 of the light emitting device of the embodiment.

A cross-sectional view of the light emitting device of the embodiment is shown in FIG. 1. In addition, top and bottom views of a substrate 1 of the light emitting device are shown in FIGS. 2(a) and 2(b), and a perspective view of through electrodes 4 of the substrate 1 of the light emitting device is shown in FIG. 3.

The light emitting device of the embodiment has a configuration in which slit-shaped through holes 3 are provided in a bottom surface 2a of a cavity (recess) 2 provided in the Si substrate 1, and the through electrodes 4 each having a shape to fill the slit-shaped through hole 3 are further provided. As shown in FIG. 2(a) and FIG. 3, the through electrode 4 is designed such that a length of an upper surface of the through electrode 4 in a long axis direction is larger than a height (a thickness direction of the Si substrate 1) of the through electrode 4, and a width of the upper surface of the through electrode 4 in a short axis direction is smaller than the height of the through electrode 4.

In addition, a light emitting element 5 is installed on the bottom surface 2a of the cavity 2, and a first element electrode 6 on a bottom surface of the light emitting element 5 is joined to the upper surfaces of the through electrodes 4 by a joining layer 8.

As described above, the through electrodes 4 each having a shape of filling the slit are joined to the element electrode 6 of the light emitting element 5 to supply a current, and therefore, a contact area between the bottom electrode 6 of the light emitting element 5 and the through electrodes 4 is larger in the long axis direction on the upper surface of the through electrode 4 than that in a case where a general columnar through electrode as described in PTL 1 and the like is used, and a large current can be uniformly and efficiently supplied to the first element electrode 6 of the light emitting element 5.

In particular, in a case where a shape of the first element electrode 6 is an electrode having a linear shape corresponding to a shape of the upper surface of the through electrode 4 having a shape of filling the silt, the upper surfaces of the through electrodes 4 are joined to the entire linear electrode via the joining layer 6, a current can be supplied to the entire surface of the linear electrode, therefore, a large current can be uniformly supplied to the linear electrode, and a semiconductor layer in a wide region can efficiently emit light.

In addition, by directly joining the through electrodes 4 to the element electrode 6 of the light emitting element 5, heat generated by the light emitting element 5 can be efficiently dissipated through the through electrodes 4. In the joining between the through electrode 4 and the element electrode 6 of the light emitting element 5, a thermal oxide film formed on the Si substrate is not interposed. Further, the through electrode 4 having a shape of filling the slit can receive, by the entire upper surface thereof, the heat generated by the light emitting element 5 and conduct the heat in the height direction while dispersing the heat in a direction parallel to the longitudinal direction of the upper surface. Therefore, the heat generated in the semiconductor layer of the light emitting element 5 can be efficiently conducted by the through electrode 4 having a shape of filling the silt, and can be dissipated to the outside of the Si substrate 1.

As compared with a large volume through electrode in which both sizes in a long axis direction and a width direction are larger than a size in a height direction, voids are less likely to be formed inside the through electrode 4 which fills the slit-shaped through hole 3 when the through electrode is formed, and as a result, the electrical resistance can be lowered and the heat conduction can be increased.

Since the through electrode 4 has a slit shape, it is possible to avoid a problem caused by a difference in thermal expansion as compared with the case where the general columnar through electrode described in PTL 1 and the like is provided. That is, it is possible to reduce the occurrence of cracks and the like caused by the difference in thermal expansion of the through electrode 4 made of metal, the substrate 1 made of Si, and the thermal oxide film ($SiO_2$) formed on the surface of the substrate 1 and the inner wall of the through hole. In particular, by forming the through electrode 4 into a slit shape, as compared with a case of a columnar shape, a proportion of the thermal oxide film is reduced and cracks generated in the thermal oxide film can be reduced.

Hereinafter, the light emitting device of the present embodiment will be described in more detail.

As shown in FIG. 1, the light emitting device of the present embodiment includes the light emitting element 5 and the Si substrate 1. The light emitting element 5 includes a semiconductor layer 15 provided with a light emitting layer, and first and second element electrodes 6 and 7.

Here, the first and second element electrodes 6 and 7 are joined to a bottom surface of the semiconductor layer 15 to supply a current for causing the light emitting layer to emit light. A cross-sectional structure of the light emitting element 5 is a structure shown in FIG. 4, and includes a semiconductor substrate 15d, an n-type semiconductor layer 15c provided on an entire lower surface of the semiconductor substrate 15d, and a light emitting layer 15a and a p-type semiconductor layer 15b provided on a lower surface of the n-type semiconductor layer 15c.

A laminate body of the light emitting layer 15a and the p-type semiconductor layer 15b is a rectangle whose width is narrower than a length, and a plurality of (six in this case) such rectangular laminate bodies are arranged in a stripe shape at predetermined intervals over the entire n-type semiconductor layer 15c. End portions of the laminate body of the light emitting layer 15a and the p-type semiconductor layer 15b are connected each other. Side surfaces of the laminate body of the light emitting layer 15a and the p-type semiconductor layer 15b are covered with an insulating layer.

Figure 4:
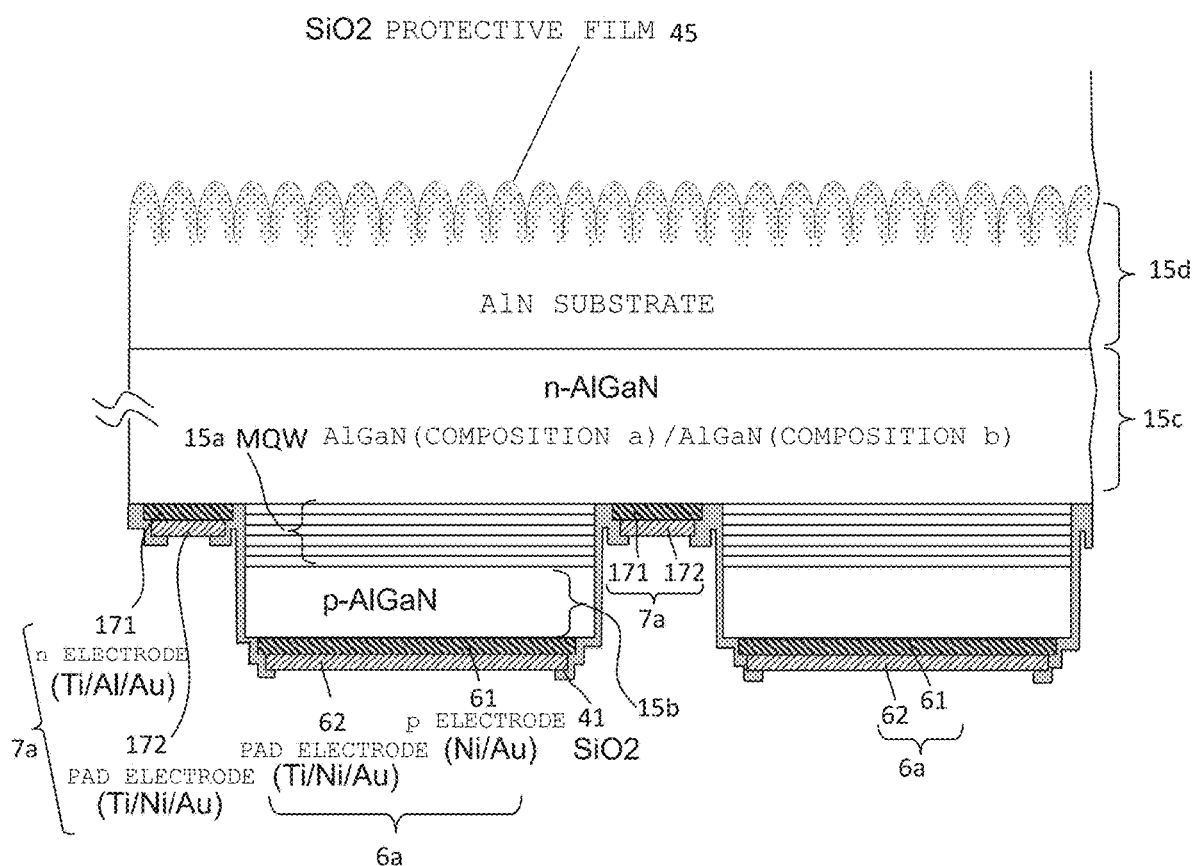
FIG. 4 is a cross-sectional view of a light emitting element 5 of the light emitting device of the embodiment.
Figure 5:
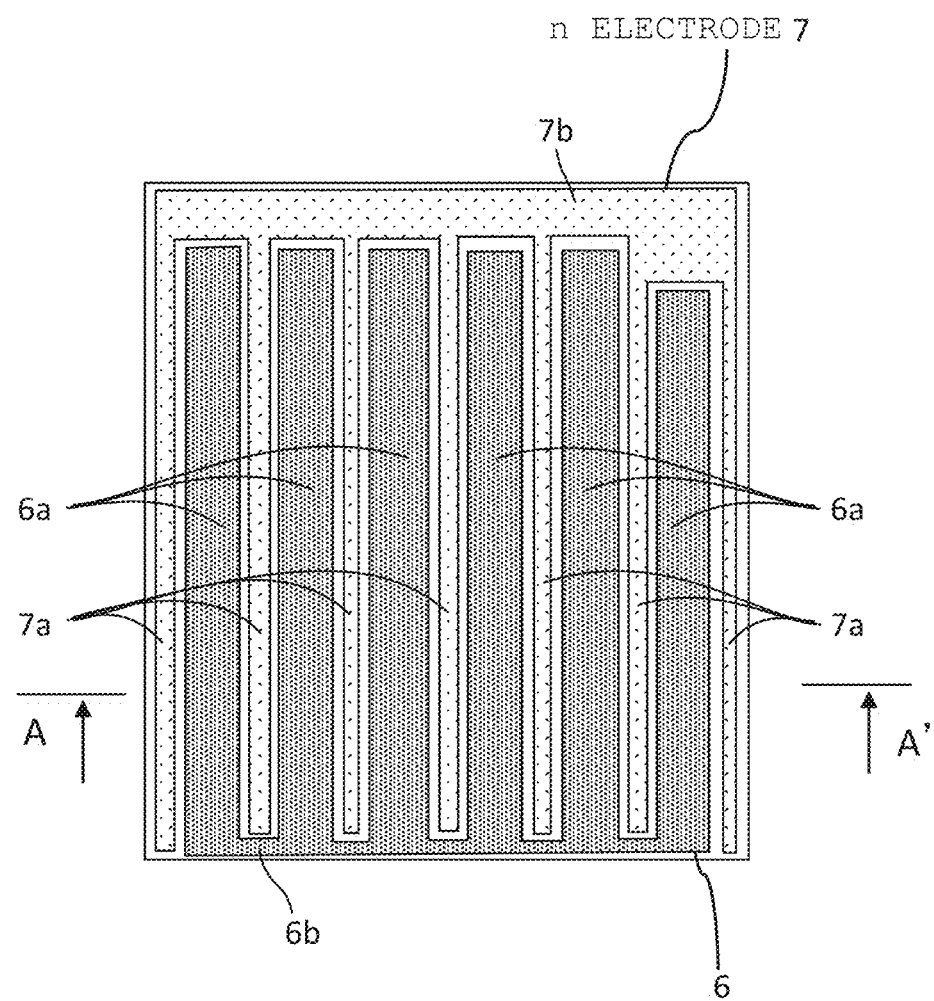
FIG. 5 is a bottom view of the light emitting element 5 of FIG. 4.

A shape of the lower surface of the light emitting element 5 is shown in FIG. 5. The first element electrode 6 includes a plurality of linear electrode portions 6a whose width is narrower than a length and a connection electrode portion 6b for connecting end portions of the linear electrode portions 6a, and has a comb shape. The linear electrode portions 6a are joined to a lower surface of the strip-shaped p-type semiconductor layer 15b along a longitudinal direction thereof. In addition, as shown in FIG. 4, the first element electrode 6 has a laminated structure of a p electrode 61 and a pad electrode 62.

Similarly, the second element electrode 7 includes linear electrode portions 7a whose width is narrower than a length and a connection electrode portion 7b for connecting end portions of the linear electrode portions 7a, and has a comb shape. The linear electrode portion 7a is disposed in a region where the n-type semiconductor layer 15c is exposed in a gap between the strip-shaped p-type semiconductor layers 15b. In addition, the second element electrode 6 has a laminated structure of an n electrode 171 and a pad electrode 172.

When a current flows between the first element electrode 6 and the second element electrode 7, a current flows through the light emitting layer 15a to cause the light emitting layer 15a to emit light, and the light is emitted from an upper surface of the semiconductor substrate 15d. The upper surface of the semiconductor substrate 15d is subjected to concave-convex processing in order to improve the light extraction efficiency. A protective layer 45 is provided on the concave-convex surface.

As shown in FIG. 4, an AlGaN-based light emitting layer 15a is used as an example of a composition of each layer of the semiconductor layer 15 for the light emitting element 5 of the present embodiment. The light emitting layer 15a emits ultraviolet light. Since the AlGaN-based light emitting layer 15a has a property of being deteriorated by humidity, the light emitting element 5 of the light emitting device of the present embodiment is hermetically sealed to prevent intrusion of moisture. A sealing structure will be described later.

Meanwhile, the Si substrate 1 is provided with the cavity 2, and the light emitting element 5 is installed on the bottom surface of the cavity 2.

As shown in FIG. 2(a), in the bottom surface region of the cavity 2 of the Si substrate 1, the slit-shaped through holes 3 are provided at positions facing the strip-shaped linear electrode portions 6a of the first element electrode 6 of the light emitting element 5. The through electrodes 4 for filling the through holes 3 are provided inside the through holes 3. A back surface electrode 11 is provided on a back surface (a surface opposite the bottom surface region of the cavity 2) of the Si substrate 1, and the back surface electrode 11 is connected to the through electrodes 4.

Further, in the bottom surface region of the cavity 2 of the Si substrate 1, a slit-shaped through hole 13 is provided at a position facing the connection electrode portion 7b of the second element electrode 7. A through electrode 14 for filling the through hole 13 is provided inside the through hole 13. A back surface electrode 12 is provided on the back surface of the Si substrate 1, and the back surface electrode 12 is connected to the through electrode 14.

As described above, the through electrode 4 has a shape as shown in FIG. 3, of which the length of the upper surface in the long axis direction is larger than the height and the width of the upper surface in the short axis direction is smaller than the height. The same applies to the shape of the through electrode 14. Specifically, for example, the length of the upper surfaces of the through electrodes 4 and 14 in the long axis direction is designed to be 3 times or more, preferably 10 times or more the width in the short axis direction.

The joining layer 8 having a shape corresponding to the shape of the upper surface of the through electrode 4 is disposed between the linear electrode portions 6a of the first element electrode 6 of the light emitting element and the upper surface of the through electrode 4 facing the linear electrode portions 6a, and the entire upper surface of the through electrode 4 is joined to the linear electrode portion 6a of the first element electrode 6 via the joining layer 8.

Similarly, the entire upper surface of the through electrode 14 is joined to the connection electrode portion 7b of the second element electrode 7 via the joining layer 8.

Figure 6:
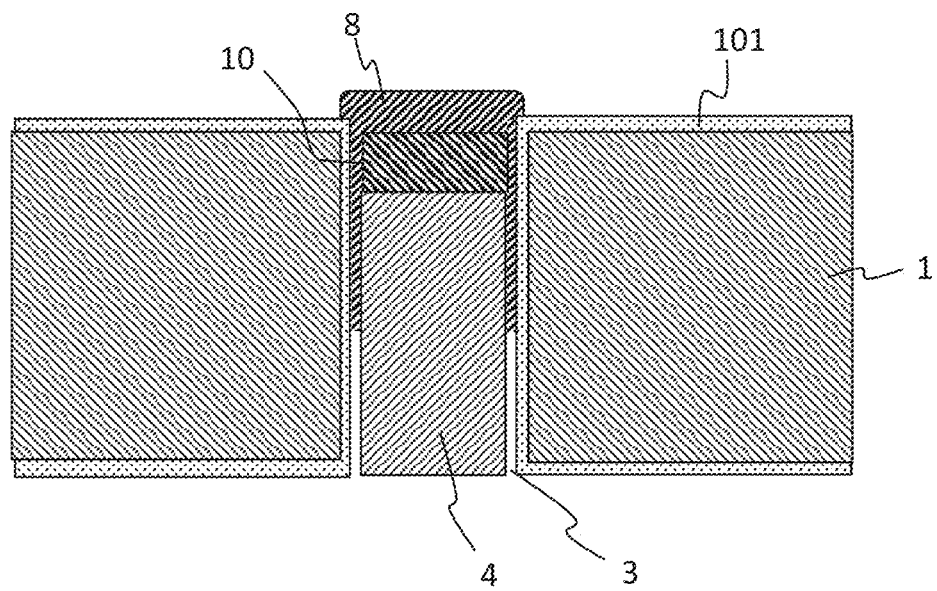
FIGS. 6(a) and 6(b) are cross-sectional views of a through electrode 4 of the Si substrate 1 of the light emitting device of the embodiment.
Figure 6:
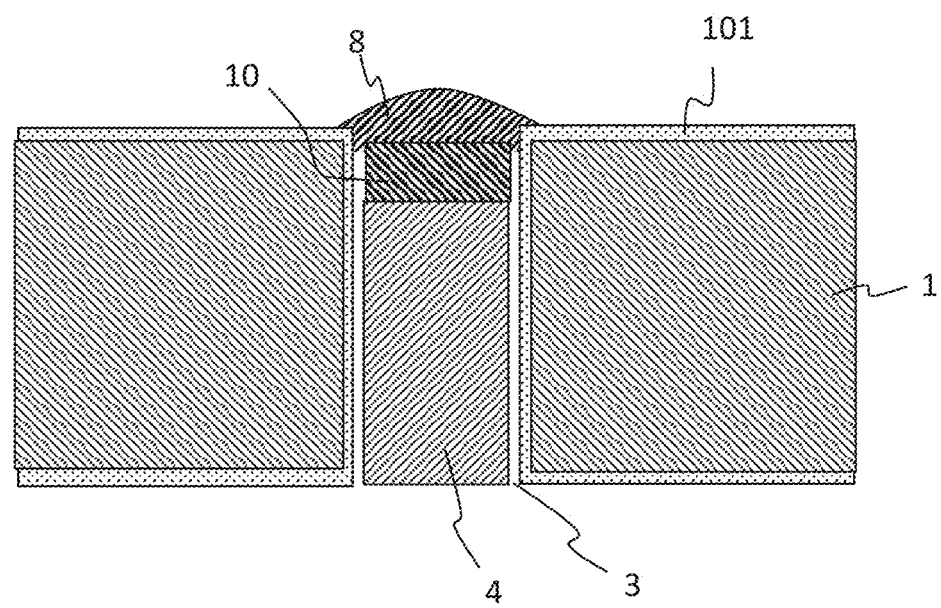

In this case, in the present embodiment, the joining layer 8 is configured such that a portion thereof also fills a very small gap existing between an upper portion of the inner wall of the through hole 3 and an upper portion of the through electrode 4 of the Si substrate 1, and a periphery of the through electrode 4 is hermetically sealed (see FIGS. 6(a) and 6(b)). In addition, FIG. 6 emphasizes the gap to show that the joining layer 8 fills the gap, and the through electrode and the inner wall of the through hole 3 are basically in close contact with each other.

Further, on an upper surface of an opening of the cavity 2, a lid member 9 for closing the opening is installed, and a periphery of the opening of the cavity 2 is hermetically sealed.

That is, in a region where the lid member 9 is installed on the Si substrate 1, a solid phase diffusion joining portion 70 for joining the Si substrate 1 and the lid member 9 by solid phase diffusion is provided. The solid phase diffusion joining portion 70 is formed in an annular shape so as to surround the light emitting element and the cavity 2.

The solid phase diffusion joining portion 70 is formed by providing a material capable of performing solid phase diffusion joining on both the lid member 9 side and the Si substrate 1 side, and using either one as a plastically deformable material. In addition, metal or Si can be used as the material capable of performing solid phase diffusion, and metal is used as the plastically deformable material. For example, the solid phase diffusion joining portion 70 may have (1) a configuration in which a metal layer formed on the Si substrate 1 side and a metal layer formed on the lid member 9 side are joined by solid phase diffusion, (2) a configuration in which a metal layer formed on the Si substrate 1 side and a Si layer formed on the lid member 9 side are joined by solid phase diffusion, and (3) a configuration in which the Si substrate 1 or a Si layer formed on the Si substrate 1 side and a metal layer formed on the lid member 9 side are joined by solid phase diffusion.

The solid phase diffusion joining portion 70 may be formed in a region where a recessed portion provided on one of the Si substrate 1 and the lid member 9 and a projection portion provided on the other of the Si substrate 1 and the lid member 9 are fitted together.

Figure 7:
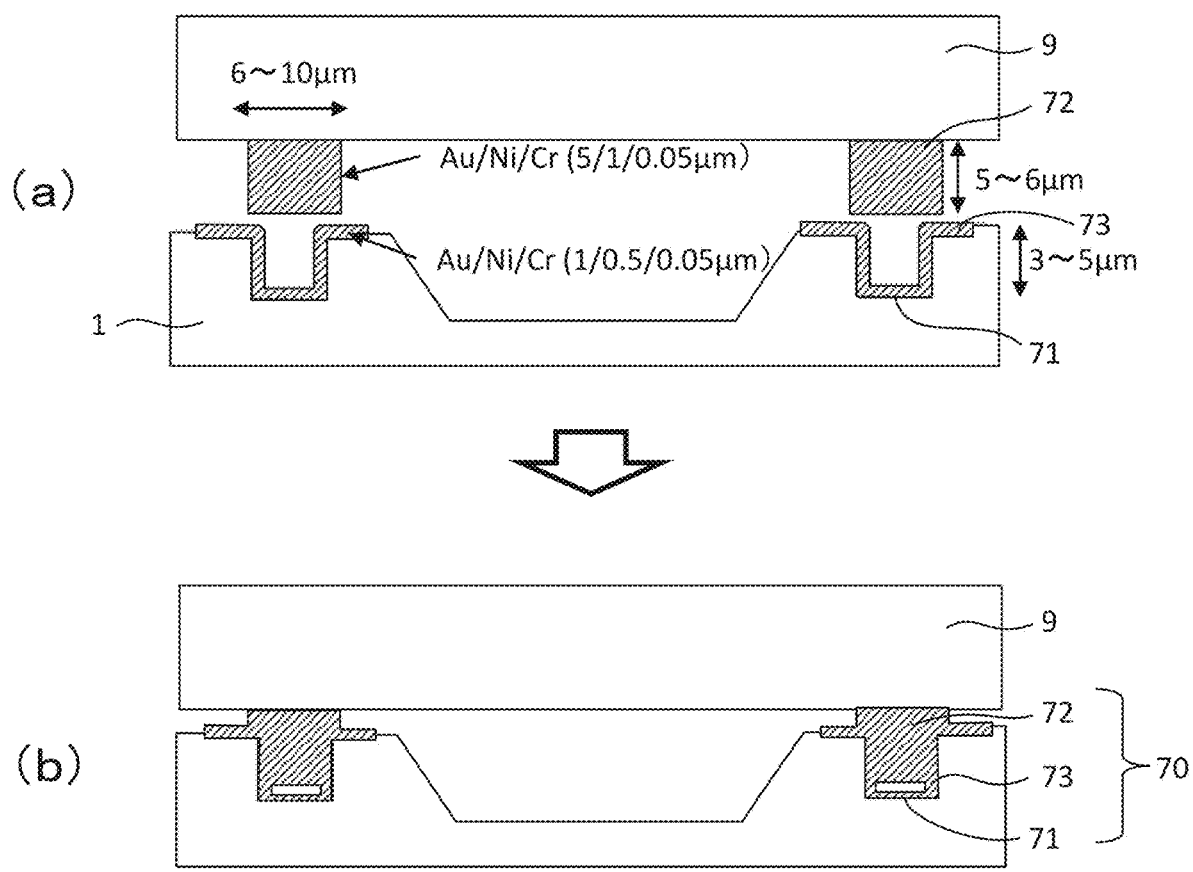
FIG. 7(a) is a view showing a step of sealing the cavity 2 of the Si substrate 1 of the light emitting device of the embodiment with a lid member 9.
FIG. 7(b) is a view showing a structure after the sealing.

For example, of a lower surface of the lid member 9 and the upper surface of the Si substrate 1, one surface (the upper surface of the Si substrate 1 side in this case) is provided with a recess portion 71 as shown in FIG. 7(a), and the other surface (the lid member 9 side in this case) is provided with a projection portion 72 configured with a plastically deformable material, and the projection portion can be inserted into the recess portion 71 and plastically deformed to fill the recess portion 71 so as to make a structure as shown in FIG. 7(b) in close contact with the recess portion 71. As a result, an inner wall of the recess portion 71 and the projection portion 72 can be joined by solid phase diffusion to form the solid phase diffusion joining portion 70 that hermetically seals the Si substrate 1 and the lid member 9.

The recess portion 71 may be completely filled with the projection portion 72 or may be filled in a state including a cavity as long as solid phase diffusion joining is performed between the inner wall of the recess portion 71 and the projection portion 72. In addition, the solid phase diffusion joining may be formed inside the inner wall of the recess portion 71, or may be formed outside the inner wall of the recess portion 71.

The projection portion 72 can be joined to the inner wall of the Si substrate 1 by solid phase diffusion, for example, when the projection portion 72 is made of a metal such that a surface thereof is an Au layer. In addition, by providing a metal layer 73 whose surface is an Au layer on the inner wall of the Si substrate 1, the projection portion 72 and the recess portion 71 can also be joined by Au—Au solid phase diffusion.

For example, in the case of the structure shown in FIG. 7(a), the projection portion 72 can have a structure in which a Cr layer, a Ni layer, and an Au layer are laminated in this order from the lid member 9 side. In addition, the metal layer 73 on the inner wall of the recess portion 71 can have a structure in which a Cr layer, a Ni layer, and an Au layer are laminated in this order from the Si substrate 1 side.

Further, as in the present embodiment, not only by forming the metal layer 73 on the Si substrate 1, but also by partially removing the thermal oxide film ($SiO_2$) formed on the surface of the Si substrate 1 to expose a part of the Si substrate 1, the exposed portion of the Si substrate 1 and the metal layer (the projection portion 72) formed on the lid member 9 side can be pressure-bonded to form the solid phase diffusion joining portion 70.

As in the present embodiment, the recess portion 71 formed on the Si substrate 1 is not limited to being formed as a groove, and may be formed such that the inner wall of the recess portion 71 is exposed on an outer surface of the Si substrate 1.

In addition, the combination of the recess portion and the projection portion forming the solid phase diffusion joining portion 70 can also be configured such that the projection portion is made of Si and the inside of the recess portion is made of a metal layer (a plating layer), and both are pressure-bonded to each other, thus the metal layer inside the recess portion is plastically deformed to cause solid phase diffusion, and the recess portion and the projection portion are joined. Specifically, as shown in FIGS. 7(a) and 7(b), the solid phase diffusion joining portion can also be formed by providing the recess portion 71 on the Si substrate 1 side, providing the metal layer 73 in the recess portion 71, attaching the projection portion 72 made of Si to the lid member 9 side by anodic oxidation joining or the like, and pressure-bonding both the recess portion and the projection portion.

Further, the solid phase diffusion joining portion is not limited to the configuration of the combination of the recess portion and the projection portion as in the light emitting device of the present embodiment, and the solid phase diffusion joining portion can also be formed on the inner wall of the cavity 2.

In addition, the lid member 9 is made of a material that transmits light emitted by the light emitting element 5, and may be a plate-shaped member or an optical component having desired optical properties such as a lens or the like.

As described above, the space inside the cavity 2 can be hermetically sealed by filling the periphery of the upper portion of the through electrode 4 with the joining layer 8 and closing the opening of the cavity 2 with the lid member 9. As a result, even when an AlGaN-based semiconductor layer that is likely to be deteriorated due to humidity is used as the semiconductor layer 15 of the light emitting element 5, the cavity 2 is kept hermetical, and thus the intrusion of moisture can be prevented to prevent the deterioration and improve the reliability.

In addition, the through electrodes 4 and 14 are configured with a metal having a melting point higher than that of the joining layer 8, and the upper surfaces of the through electrodes 4 and 14 are designed to be located inside the through holes 3 and 13 with respect to the bottom surface of the cavity 2 of the Si substrate 1. As a result, even when the through electrodes 4 and 14 are formed in the bottom surface of the cavity 2 by plating, it is possible to prevent the through electrodes 4 and 14 from protruding from the bottom surface of the cavity 2 of the Si substrate and hindering the installation of the light emitting element 5.

Moreover, by using the joining layer 8 having a melting point lower than those of the through electrodes 4 and 14, the upper surfaces of the through electrodes 4 and 14 can be joined to the first and second element electrodes 6 and 7 by melting the joining layer 8.

In addition, a barrier layer 10 for preventing the through electrodes 4 and 14 from being mixed with the joining layer 8 is provided between the through electrodes 4 and 14 and the joining layer 8. By providing the barrier layer 10, when the joining layer 8 is melted, the materials configuring the through electrodes 4 and 14 are not mixed with the joining layer 8. Therefore, even when a eutectic alloy such as eutectic solder is used as the joining layer 8, the melting point and alloy properties thereof can be maintained. In addition, an upper surface of the barrier layer 10 is desirably formed to be located inside the through hole 3 with respect to the upper surface of the cavity 2 so as not to hinder the installation of the light emitting element 5.

For example, the through electrodes 4 and 14 can be made of Cu, and an AuSn layer can be used as the joining layer 8. In this case, a Ni layer can be used as the barrier layer 10.

<Manufacturing Method of Light Emitting Device>

Here, a manufacturing method of the light emitting device of the present embodiment will be described.

Figure 8:
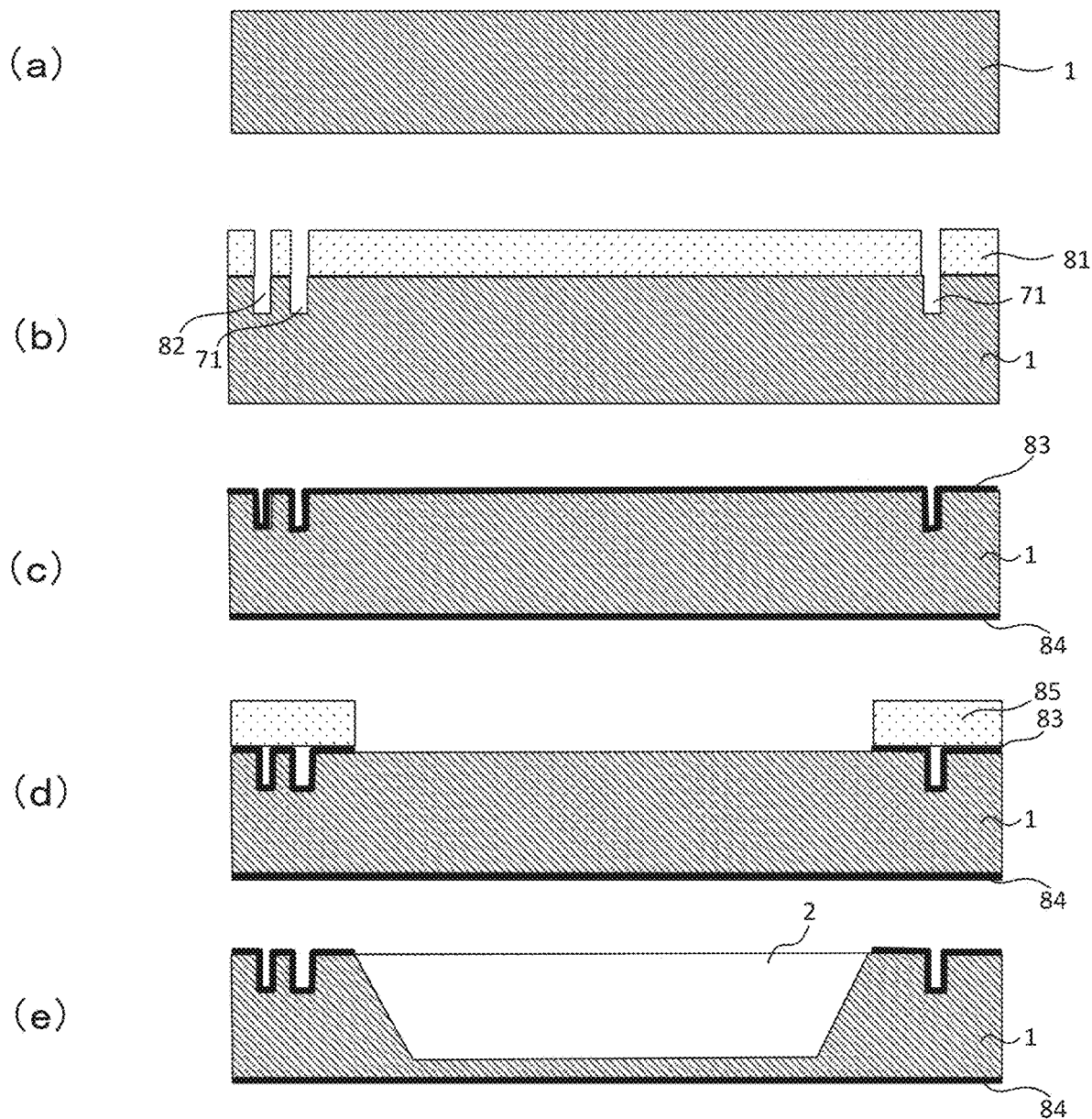
FIGS. 8(a) to 8(e) are cross-sectional views showing a manufacturing process of the light emitting device according to the embodiment.

As shown in FIG. 8(a), a bare Si wafer (thickness: 400 μm) having a crystal plane orientation of (100) is prepared as the Si substrate 1, and as shown in FIG. 8(b), a resist mask 81 is formed on the surface, and an alignment mark 82 which is a recess portion, and the recess portion 71 for sealing are formed by deep reactive ion etching (DRIE). The recess portion 71 has such a size that, for example, an opening width is 3 μm to 5 μm and a depth is 3 μm to 5 μm.

As shown in FIG. 8(c), after the resist mask 81 is removed, thermal oxide films ($SiO_2$) 83 and 84 are formed on both surfaces of the Si substrate 1 to a thickness of, for example, about 1 μm.

Next, as shown in FIG. 8(d), a resist mask 85 is formed on a surface of the Si substrate 1 on a side where the recess portion 71 is formed, and the thermal oxide film 83 in a region serving as the opening of the cavity 2 is removed by dry etching. Further, as shown in FIG. 8(e), the cavity 2 is formed by Si crystal anisotropic etching using the thermal oxide films 83 and 84 as masks. As an etching solution, for example, a 25 wt % Tetrameryl ammonium hydroxide (TMAH) solution is used, and etching is performed at 80° C. for 13 hours, whereby the cavity 2 having a depth of 300 μm and a thickness of the Si substrate 1 at the bottom surface of 100 μm is formed.

Figure 9:
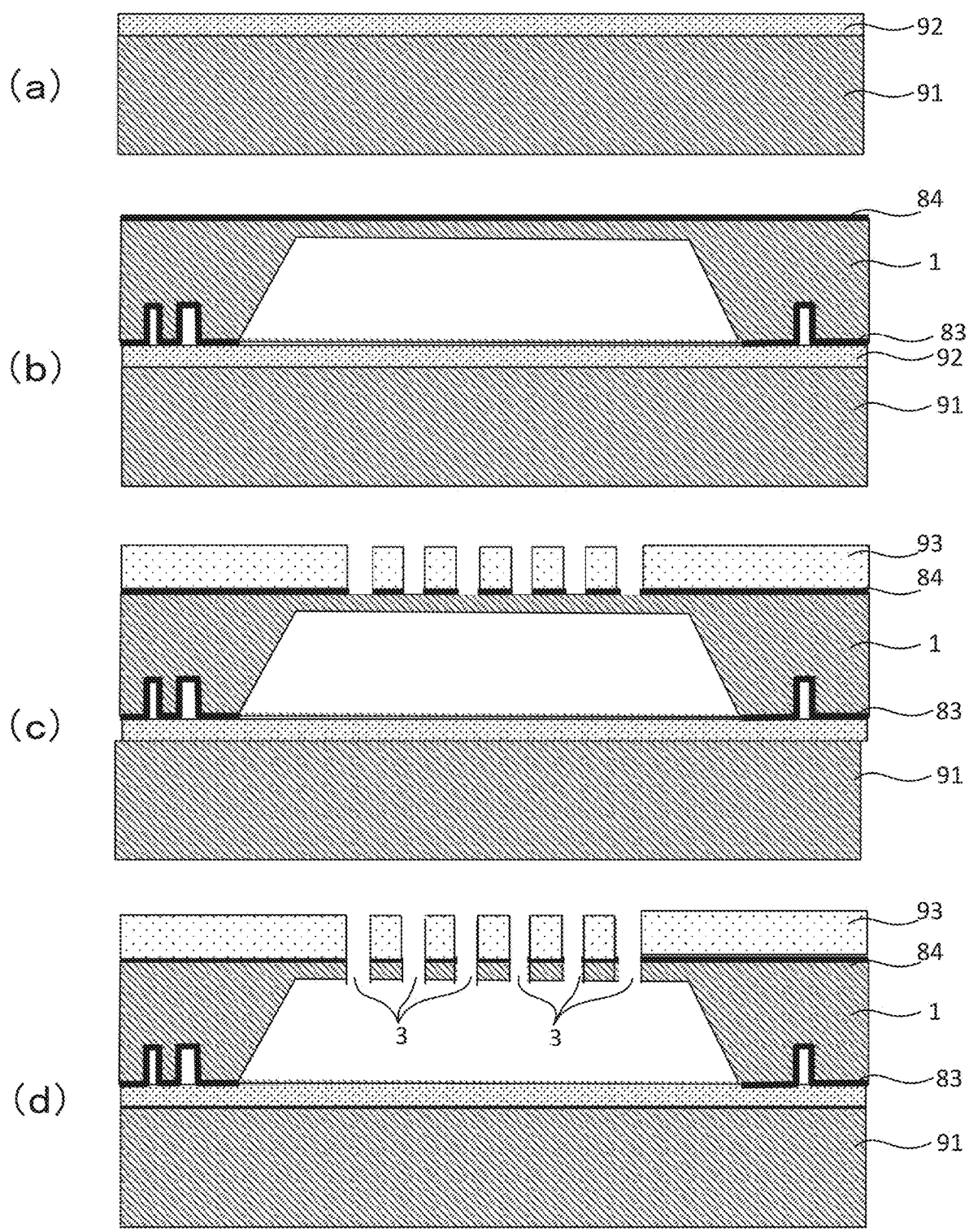
FIGS. 9(a) to 9(d) are cross-sectional views showing the manufacturing process of the light emitting device according to the embodiment.

Meanwhile, as shown in FIG. 9(a), a Si substrate serving as a support substrate 91 is prepared, and wax is applied to one surface of the Si substrate to form a wax layer 92. As shown in FIG. 9(b), the support substrate 91 is fixed by the wax layer 92 to a surface on the opening side of the cavity 2 of the Si substrate 1 in which the cavity 2 is formed. For example, the support substrate 91 is fixed to the Si substrate 1 by heating the support substrate 91 to 140° C. with a wafer bonder and pressing the support substrate 91 with a pressure of 1000 N.

Next, as shown in FIG. 9(c), a resist mask 93 is formed on the thermal oxide film 84 of the Si substrate 1, and the thermal oxide film 84 at positions where the slit-shaped through holes 3 and 13 are to be formed is removed by dry etching using a reactive ion etching device or the like.

As shown in FIG. 9(d), the slit-shaped through holes 3 and 13 are formed by using the resist mask 93 and the thermal oxide film 84 as masks, and performing deep reactive ion etching on the Si substrate 1 by using a reactive ion etching device or the like.

Figure 10:
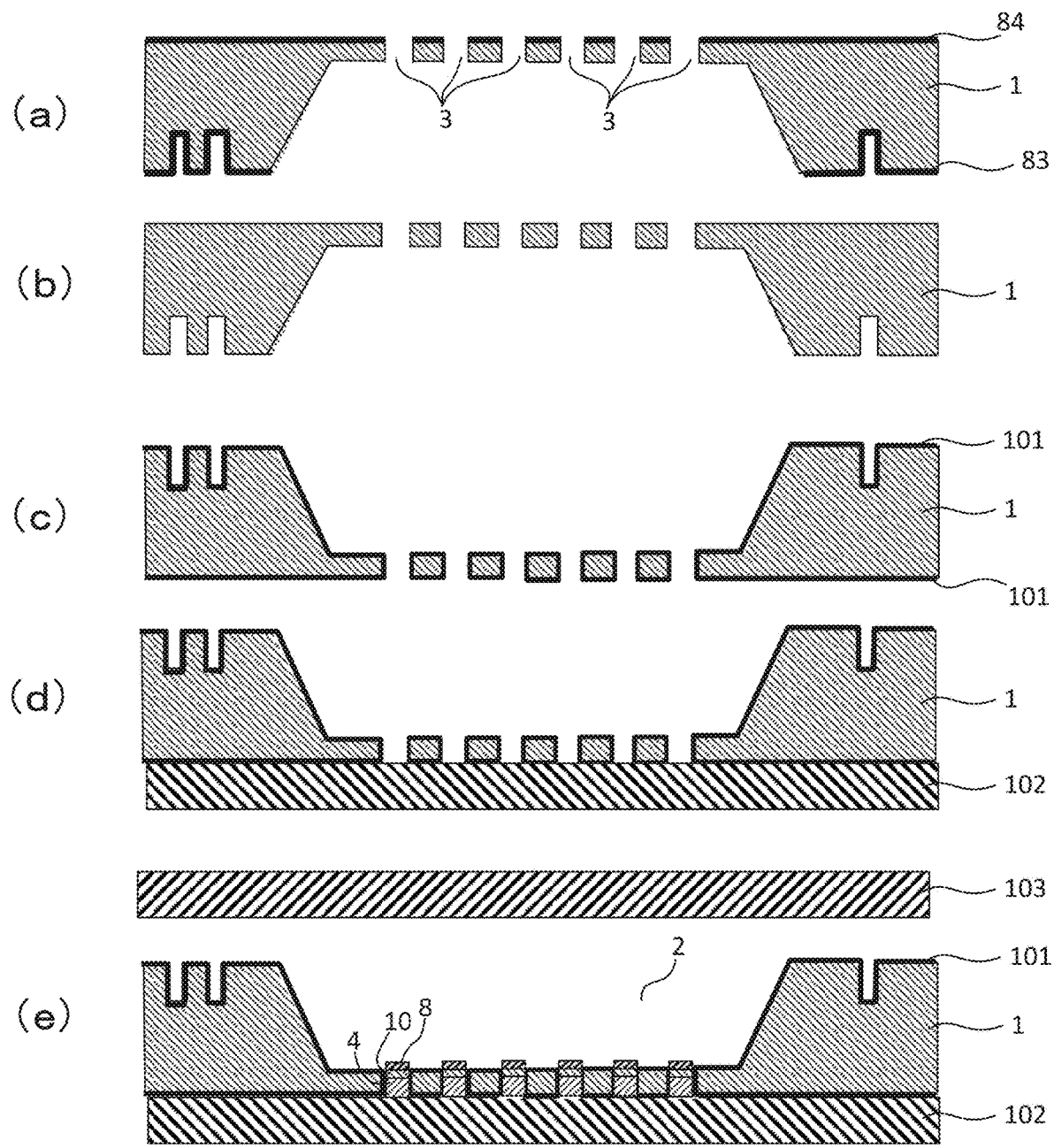
FIGS. 10(a) to 10(e) are cross-sectional views showing the manufacturing process of the light emitting device according to the embodiment.

As shown in FIG. 10(a), after the mask 93 is peeled and removed from the support substrate 91, the support substrate 91 is immersed in a buffered hydrofluoric acid (BHF) solution to remove the thermal oxide films 83 and 84 from the Si substrate 1 as shown in FIG. 10(b).

As shown in FIG. 10(c), a thermal oxide film having a thickness of about 1 μm is formed on the entire surface of the Si substrate 1 including the inner walls of the through holes 3 and 13.

As shown in FIG. 10(d), a Cu electrode 102 for electroplating is attached to the back surface of the Si substrate using an adhesive tape or the like. At this time, the adhesive tape or the like is attached such that no gap is formed between the Si substrate 1 and the Cu electrode.

As shown in FIG. 10(e), an electrode 103 is disposed on the opening side of the cavity 2 of the Si substrate 1, a voltage is applied between the electrodes 102 and 103, and electroplating is performed to continuously laminate a Cu layer (95 μm), a Ni layer (5 μm), and an AuSn layer (5 μm) in this order from the Cu electrode 102 side in the through holes 3 and 13 of the Si substrate 1. Regarding a plating solution, at the start, a copper sulfate solution is used as a plating bath to form the Cu layer, and if the Cu layer is formed to have a desired thickness, the plating bath is changed to one corresponding to Ni and AuSn to form the Ni layer and the AuSn layer.

The Cu layer is the through electrode 4, the Ni layer is the barrier layer 10, and the AuSn layer is the joining layer 8.

The upper surface of the barrier layer (the Ni layer) 10 is located inside the through holes 3 and 13 with respect to an upper surface of a thermal oxide film 101 on the Si substrate 1. The upper surface of the joining layer 8 projects into the cavity 2 from the upper surface of the thermal oxide film 101 on the Si substrate 1.

Here, the shape of each of the through holes 3 and 13 has such a size that the size of the opening in the long axis direction is larger than the height (the thickness direction of the Si substrate 1) and the size of the opening in the short axis direction is smaller than the height, and therefore, by adjusting an additive to be added to the plating bath and an energization quantity, the Cu layer, the Ni layer, and the AuSn layer without voids can be formed by plating.

In addition, before the electroplating, seed layer formation based on sputtering and seed layer formation based on non-electroplating are not performed. This is because when a seed layer is formed, voids are likely to occur in the through electrode 4, the barrier layer 10, and the joining layer 8 formed by electroplating.

Figure 11:
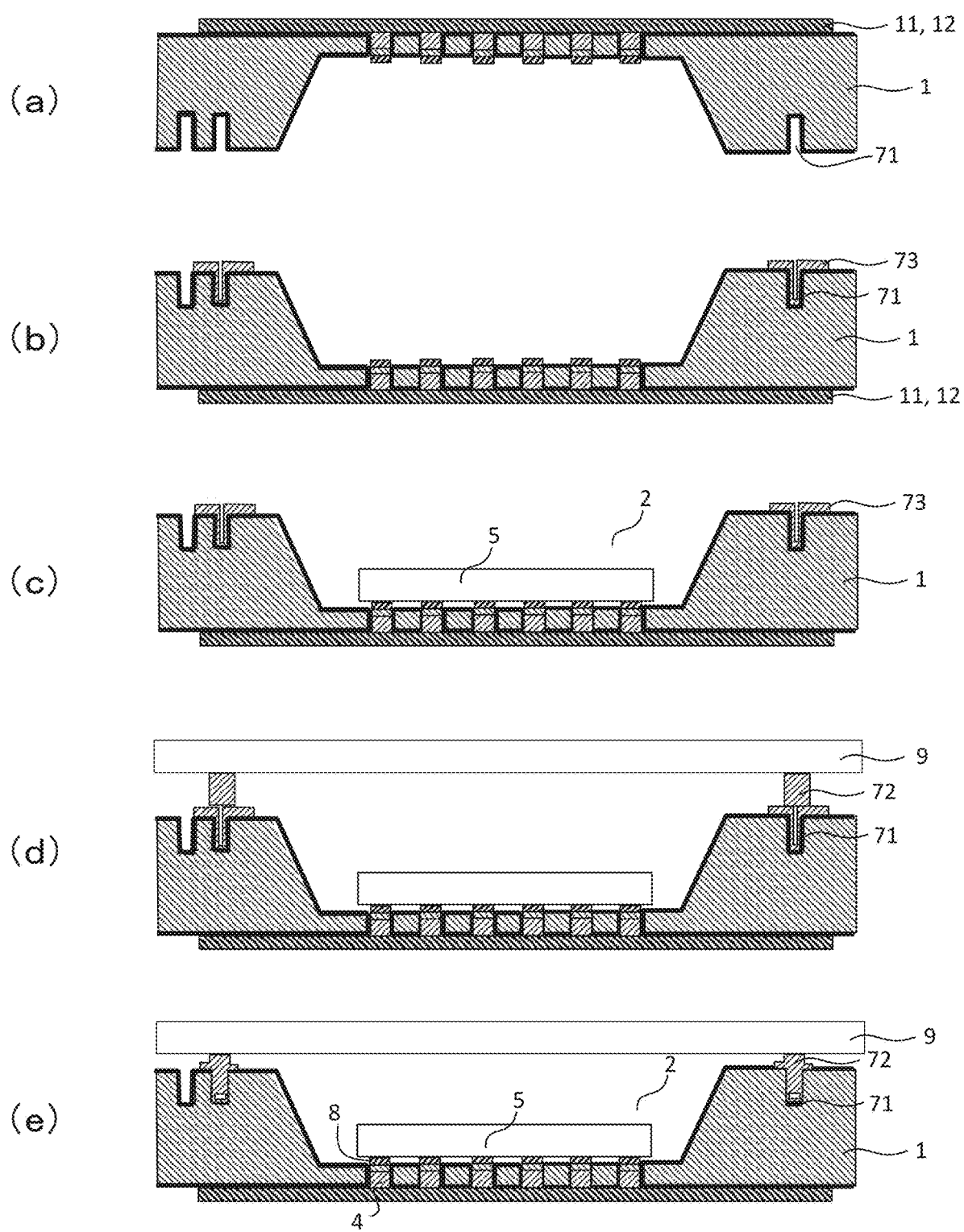
FIGS. 11(a) to 11(e) are cross-sectional views showing the manufacturing process of the light emitting device according to the embodiment.

As shown in FIG. 11(a), the back surface electrodes 11 and 12 are formed on the back surface of the Si substrate 1 by a lift-off process. For example, the back surface electrodes 11 and 12 each have a structure in which a Ti layer (0.05 μm), a Cu layer (0.1 μm), a Ni layer (1 μm), and an Au layer (0.5 μm) are laminated in this order from the Si substrate 1 side.

As shown in FIG. 11(b), the metal layer 73 is formed at least on the inner wall of the recess portion 71 of the Si substrate 1 and around an opening of the recess portion 71. Specifically, for example, the metal layer 73 is formed by forming a Ti layer (0.05 μm), a Ni layer (0.5 μm), and an Au layer (1 μm) in this order from the Si substrate 1 side by sputtering film deposition using a stencil mask.

As shown in FIG. 11(c), after the separately manufactured light emitting element 5 is installed on the bottom surface of the cavity 2 such that the first and second element electrodes 6 and 7 are in contact with the joining layer 8, the joining layer 8 is melted by being heated, and the first and second element electrodes 6 and 7 and the through electrodes 4 and 14 are joined by the joining layer 8. For example, joining is performed by heating the joining layer 8 at 340° C. for 10 seconds. The light emitting element 5 is an LED that emits ultraviolet light.

In this case, by melting the joining layer 8, while the first and second element electrodes 6 and 7 of the light emitting element 5 are joined with the through electrodes 4 and 14 by the joining layer 8, the gaps between the inner walls of the through holes 3 and 13 and the through electrodes 4 and 14 at the upper portions of the through holes 3 and 13 can be filled with the melted substance of the joining layer 8. As a result, the through holes 3 and 13 and the through electrodes 4 and 14 can be sealed.

As shown in FIG. 11(d), the lid member 9 is prepared, and the projection portion 72 is formed of metal at a position facing the recess portion 71 of the Si substrate 1. For example, quartz glass is prepared as the lid member 9, a Cr layer (0.05 μm) is formed by sputtering film deposition, and then a Ni layer (1 μm) and an Au layer (5 μm) are laminated on the Cr layer by electroplating, and a metal layer in the shape of the projection portion 72 is formed by a lift-off process. A width of the projection portion 72 is, for example, 6 μm to 10 μm.

As shown in FIG. 11(e), the projection portion 72 of the lid member 9 is inserted into the recess portion 71 by applying a load (for example, about 3000 N) without being heated (100° C. or lower). Since the width of the projection portion 72 is larger than an inner diameter of the recess portion 71, the projection portion 72 is in close contact with the surface of the metal layer 73, and a high pressure is locally applied to the recess portion 71 and the metal layer 73 inside the recess portion 71, resulting in plastic deformation of the crystal of the Au layers on an outermost surfaces of the projection portion 72 and the metal layer 73. During the plastic deformation, a sliding displacement occurs on the Au crystal planes, and clean crystal planes appear. The clean crystal planes of the Au layers on the projection portion 72 side and on the metal layer 73 side form a strong joining. The joining is a solid phase diffusion joining at an atomic level, and the strength of the joining surface is as high as the bonding strength of a metal (Au) bulk. As a result, the periphery of the cavity 2 can be sealed with high hermeticity.

In addition, in order to promote the sliding displacement of the crystal planes, a temperature of 100° C. to 200° C. is effective, and by setting the temperature to this level, a load required for joining can be reduced. By inserting the projection portion 72 into the recess portion 71, it is not necessary to perform separate heating because the temperature locally rises due to frictional heat, but the temperature may be heated to less than 200° C. to reduce the residual stress caused by load reduction. As described above, since the periphery of the cavity 2 and the lid member 9 can be joined at a temperature lower than the melting point of the joining layer 8 (the AuSn layer), the joining layer 8 can be sealed without being remelted.

As described above, the light emitting device of the present embodiment can be manufactured.

Here, the recess portion 71 has a structure in which the inner wall is perpendicular to the Si substrate 1, but the recess portion 71 may have a structure in which the inner wall is inclined with respect to the Si substrate 1 or a structure of a stepped inner wall.

In addition, the projection portion 72 and the metal layer 73 are not limited to use an Au layer as the outermost surfaces thereof, and solid-phase joining can also be performed when a Cu layer or an Ag layer is used as the outermost surface layers thereof. In this case, since the Cu layer is hard, when the projection portion 72 is inserted into the recess portion 71, it is desirable to heat the projection portion 72 such that the temperature of the inserted portion reaches about 250° C. Meanwhile, since a surface of the Ag layer is likely to be oxidized or sulfurized, it is desirable to perform solid-phase joining in an inert gas.

In addition, in the present embodiment, as shown in FIGS. 4 and 5, an example of the light emitting element 5 in which the first element electrode 6 includes linear electrode portions 6a each disposed in a stripe shape is described, but the light emitting element 5 of the present embodiment is not limited to this structure. It is also possible to use a light emitting element 5 in which the first element electrode 6 is provided on the entire lower surface of the semiconductor layer. In this case, by providing the through electrodes 4 as shown in FIG. 2(a), the through electrodes 4 having few voids can efficiently supply a current to the entire first element electrode 6, and can efficiently conduct the heat generated by the light emitting element 5 to dissipate heat.

Figure 12:
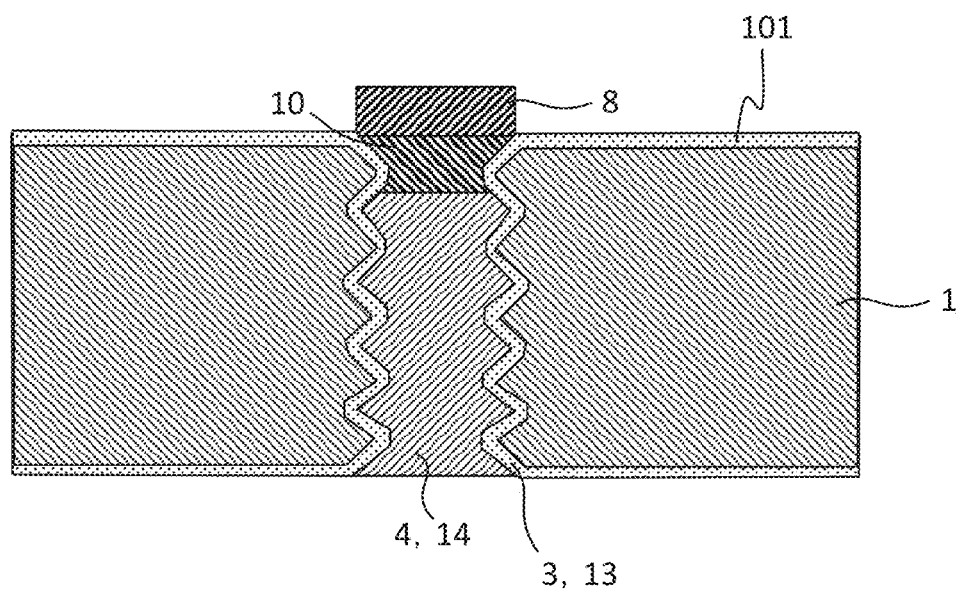
FIG. 12 is a cross-sectional view showing an example in which inner walls of through holes 3 and 13 of the Si substrate 1 of the light emitting device of the embodiment are formed in an uneven shape.

In the present embodiment, inner wall surfaces of the through holes 3 and 13 have a shape perpendicular to a main plane of the Si substrate 1, but as shown in FIG. 12, the inner walls of the through holes 3 and 13 each may be formed in an uneven shape. By forming the inner walls of the through holes 3 and 13 uneven as shown in FIG. 12, the adhesion performance between the inner walls of the through holes 3 and 13 and the through electrodes 4 and 14 as well as the barrier layer 10 can be improved, thereby further improving the hermeticity.

In the present embodiment, since the cavity 2 is formed by performing crystal anisotropic etching on the Si substrate 1, a cavity structure having a mirrored inclined surface and a bottom surface can be formed. In addition, the inclined surface of the cavity 2 of the Si substrate 1 has a reflectance of 50% to 70% of ultraviolet light, which is higher than a reflectance of about 20% of an AlN ceramic package in the related art. Therefore, the light emitting device of the present embodiment can reflect ultraviolet light emitted by the light emitting element 5 by the inclined surface and the bottom surface with high efficiency, and can improve the emission efficiency of the light.

In addition, in the present embodiment, since the joining layer (the AuSn layer) 8 that melts when the light emitting element 5 is joined is formed on the upper portion of the through electrode 4, it is not necessary for the upper surface of the through electrode 4 to protrude from the bottom surface of the cavity 2. Therefore, there is an advantage that when the light emitting element 5 is installed, the light emitting element 5 can be installed on the flat bottom surface of the cavity 2 without being hindered by the upper portion of the through electrode 4.

In addition, in the light emitting device of the present embodiment, the thickness of the Si substrate 1 on the bottom surface of the cavity 2 can be set to, for example, 100 µm, which is much thinner than that of the ceramic package (500 µm) in the related art and is excellent in heat dissipation.

Further, the light emitting device of the present embodiment is excellent in heat dissipation because the heat of the light emitting element 5 is directly dissipated by the through electrodes 4 and 14 that fill the slit-shaped through holes 3 and 13 provided on the thin bottom surface of the cavity 2.

In particular, by providing a plurality of through electrodes 4 and 14, the area of the upper surfaces of the through electrodes 4 and 14 can be 50% or more of an area of a bottom surface of the light emitting element 5. Therefore, the light emitting device can exhibit a heat dissipation property more than twice that of the ceramic package in the related art.

In addition, since the light emitting device of the present embodiment has good heat dissipation, the amount of current that flows through the light emitting element 5 increases, and as a result, the light output increases.

The light emitting device of the present embodiment is excellent in productivity because a Si wafer used as the Si substrate 1 can be collectively processed and manufactured by a micro electro mechanical systems (MEMS) process. In addition, the light emitting device is excellent in small size and thinness.

Further, since a bare Si wafer is used as the Si substrate 1, the light emitting device of the present embodiment can be manufactured at a low cost as compared with a light emitting device in which a cavity is formed by AlN ceramic.

In the manufacturing method of the light emitting device of the present embodiment, since the opening of the cavity 2 can be sealed by the lid member 9 at a room temperature after the light emitting element 5 is mounted on the Si substrate 1 by the joining layer 8, there is no step of heating to rise the temperature to a temperature higher than the melting point of the joining layer 8. Therefore, a risk of joining defects and the like caused by the remelting of the joining layer 8 can be avoided, and the manufacturing cost can be reduced.

In addition, since the step of sealing the opening of the cavity 2 with the lid member 9 is a step of pressing the lid member 9 against the cavity 2, the step can be collectively performed for each wafer, and is excellent in productivity.

In particular, since the sealing step between the lid member 9 and the periphery of the cavity 2 of the Si substrate 1 can be performed at a room temperature, even when quartz is used as the lid member 9, cracking or peeling caused by stress strain due to a difference in thermal expansion coefficient between the Si substrate 1 and quartz does not occur. As a result, it is possible to use a large-diameter wafer of 6 inches or more as the Si substrate 1 and install the lid member 9 to seal the opening of the cavity 2 of the Si substrate 1 in wafer units, the production efficiency can be significantly improved as compared with individual mounting in the related art, and the manufacturing cost can be significantly reduced.

In addition, when the first element electrode 6 includes the linear electrode portions 6a, the shape of the through electrode 4 can be made to correspond to the shape of the linear electrode portion 6a in a one-to-one relation. Further, when the electrode portion is other than the linear electrode portion 6a, an electrode thereof can also be made to correspond to the shape of the through electrode 4. Further, the through electrode 4 that fills the slit-shaped through hole can be formed in combination with a square or rectangular through electrode. As a result, a rewiring pattern for connecting the through electrodes 4 to the first element electrode 6 on the surface of the Si substrate 1 on the bottom surface of the cavity 2 is not required, and the through electrodes 4 and the first element electrode 6 can be directly connected.

In addition, in the present embodiment, the shape of the through electrode 4 and the shape of the linear electrode portion 6a correspond to each other in a one-to-one relation, but the present embodiment is not limited to the one-to-one correspondence. A part of or all of the plurality of through electrodes 4 may be connected to each other so as to form an integrated shape, or a part of or all of the linear electrode portions 6a be connected to each other so as to form an integrated shape.

Further, AlGaN, serving as the light emitting layer of the light emitting element that emits ultraviolet light, is likely to be deteriorated due to water content (moisture), but the light emitting device of the present embodiment can ensure hermeticity in the cavity 2.

As described above, in the light emitting device of the present embodiment, by an electroplating step, a structure is obtained in which the upper surfaces of the through electrodes 4 and 14 and the barrier layer 10 are located inside the through holes 3 and 13 in the bottom surface of the cavity 2, the upper surface of the joining layer (the AuSn layer) 8 forms an electrode structure that protrudes several micrometers from the bottom surface of the cavity 2, minute gaps between the through holes 3 and 13 and the through electrodes 4 and 14 are filled by molten AuSn, and the hermeticity required by an ultraviolet light emitting element is ensured. The invention is not limited to this configuration, and may have a structure in which the hermeticity of the through holes 3 and 13 is ensured by devising the structures of the back surface electrodes 11 and 12.

Specifically, each of the back surface electrodes 11 and 12 has a laminated structure of a Ni layer, a Cu layer, a Ni layer, and an Au layer in this order from the Si substrate 1 side. As a result, the adhesion performance can be improved by solid phase diffusion of Cu between the Cu of the through electrodes 4 and 14 and the Cu layer of each of the back surface electrodes 11 and 12, and further, the Ni layer and Au layer of the back surface electrode can cap minute gaps between the through holes 3 and 13 and the through electrode 4. As a result, the hermeticity of the through holes 3 and 13 can be ensured.

In addition, in the above embodiment, the recess portion 71 around the cavity 2 is formed in a single row, but the hermetic sealability can be further improved by forming two or more rows.

In the light emitting device of the present embodiment, single crystal Si is used as the Si substrate 1, but polycrystalline Si can also be used. When polycrystalline Si is used as the Si substrate, by performing cavity processing by a dry process, a through hole forming step, a through electrode forming step, and a trench forming step can be performed in the same manner as the steps of the manufacturing method of the light emitting device of the present embodiment using the single crystal Si substrate.

The light emitting device of the present embodiment can be used as a light emitting device in which a vertical cavity surface emitting laser (VCSEL) element is used as the light emitting element 5, or a light emitting device in which the VCSEL elements are arranged in an array. In addition, the light emitting device of the present embodiment can be used as an ultraviolet light emitting device in which an ultraviolet light LED is used as the light emitting element 5. Further, a visible light LED light emitting device can be provided by setting a structure in which an LED that emits ultraviolet light is used as the light emitting element 5 and a phosphor or a phosphor layer is coated on the lid member 9.

REFERENCE SIGN LIST

1 Si substrate
2 cavity
2a bottom surface of cavity
3, 13 slit-shaped through hole
4, 14 through electrode
5 light emitting element
6 first element electrode
7 second element electrode
8 joining layer
11, 12 back surface electrode
72 projection portion

The invention claimed is:

1. A light emitting device, comprising:
 a light emitting element including:
  a semiconductor layer which includes a light emitting layer; and
  a first element electrode and a second element electrode which are joined to the semiconductor layer and through which a current for causing the light emitting layer to emit light is to be supplied; and
 a Si substrate provided with a cavity, the light emitting element being installed on a bottom surface of the cavity,
 wherein:
 the first element electrode is disposed on a surface of the semiconductor layer which faces the bottom surface of the cavity,
 a slit-shaped through hole extends from the bottom surface of the cavity through the Si substrate in a thickness direction of the Si substrate, and a through electrode at least partially fills the through hole,
 the through hole and the through electrode are provided at a position facing the first element electrode of the light emitting element,
 a length of an upper surface of the through electrode in a long axis direction is larger than a height of the through electrode in the thickness direction of the Si substrate, and a length of the upper surface of the through electrode in a short axis direction is smaller than the height,
 a joining layer having a shape corresponding to a shape of the upper surface of the through electrode is disposed between the first element electrode of the light emitting element and the upper surface of the through electrode facing the first element electrode,
 an entire upper surface of the through electrode is joined to the first element electrode via the joining layer, and
 a part of the joining layer fills a gap between an upper portion of an inner wall of the through hole of the Si substrate and the through electrode.

2. The light emitting device according to claim 1, wherein on an upper surface of an opening of the cavity, a lid member which allows light emitted by the light emitting element to pass through and closes the opening is installed.

3. The light emitting device according to claim 1, wherein:
 the first element electrode includes a plurality of linear electrode portions each having a width narrower than a length thereof, and the plurality of linear electrode portions are arranged adjacently at predetermined intervals in a width direction of the linear electrode portion, and
 the through electrode is one of a plurality of through electrodes disposed such that each through electrode faces a corresponding one of the plurality of linear electrode portions.

4. The light emitting device according to claim 1, wherein the length of the upper surface of the through electrode in the long axis direction is three times or more a width of the upper surface of the through electrode in the short axis direction.

5. The light emitting device according to claim 3, wherein:
the surface of the semiconductor layer which faces the bottom surface of the cavity has a region in which, when viewed in a plan view, a p-type semiconductor layer and an n-type semiconductor layer are alternately arranged in a striped pattern, and
the first element electrode includes the plurality of linear electrode portions, and the plurality of linear electrode portions are joined to the striped p-type semiconductor layer.

6. The light emitting device according to claim 1, wherein the through electrode is configured with a metal having a melting point higher than that of the joining layer, and the upper surface of the through electrode is located inside the through hole with respect to the bottom surface of the cavity of the Si substrate.

7. The light emitting device according to claim 2, wherein:
in a region of the Si substrate where the lid member is installed, a solid phase diffusion joining portion for joining the Si substrate and the lid member by solid phase diffusion is provided, and
the solid phase diffusion joining portion is formed in an annular shape so as to surround the light emitting element when viewed in a plan view.

8. The light emitting device according to claim 7, wherein the solid phase diffusion joining portion is any one of:
a joining portion in which a metal layer formed on a Si substrate side and a metal layer formed on a lid member side are joined by solid phase diffusion,
a joining portion in which a metal layer formed on the Si substrate side and a Si layer formed on the lid member side are joined by solid phase diffusion, and
a joining portion in which the Si substrate or a Si layer formed on the Si substrate side and a metal layer formed on the lid member side are joined by solid phase diffusion.

9. The light emitting device according to claim 7, wherein the solid phase diffusion joining portion is formed in a region where a recess portion provided on one of the Si substrate and the lid member and a projection portion provided on the other of the Si substrate and the lid member are fitted together.

10. The light emitting device according to claim 5, wherein:
the second element electrode includes second linear electrode portions each having a width narrower than a length thereof and a connection electrode portion that connects the second linear electrode portions,
the second linear electrode portions and the linear electrode portions of the first element electrode are alternately arranged when viewed in the plan view, and are joined to the striped n-type semiconductor layer,
a slit-shaped second through hole extends from the bottom surface of the cavity through the Si substrate in the thickness direction of the Si substrate, and a second through electrode at least partially fills the second through hole,
the second through hole and the second through electrode are provided at a position facing the connection electrode portion, a length of an upper surface of the second through electrode in a long axis direction is larger than a height of the second through electrode in the thickness direction of the Si substrate,
a second joining layer having a shape corresponding to a shape of the upper surface of the second through electrode is disposed between the connection electrode portion of the light emitting element and the upper surface of the second through electrode, and
an entire upper surface of the second through electrode is joined to the connection electrode portion via the second joining layer.

11. The light emitting device according to claim 3, wherein the first element electrode includes at least three of the linear electrode portions, and the at least three of the linear electrode portions are arranged adjacently at the predetermined intervals across an entirety of a surface of the semiconductor layer which faces the bottom surface of the cavity.

12. The light emitting device according to claim 1, wherein:
a barrier layer which prevents the through electrode from being mixed with the joining layer is disposed between the through electrode and the joining layer, and
an upper surface of the barrier layer is located inside the through hole with respect to the bottom surface of the cavity.

13. The light emitting device according to claim 12, wherein the through electrode is configured with Cu, the joining layer is configured with AuSn, and the barrier layer is configured with Ni.

14. The light emitting device according to claim 1, wherein the light emitting element is configured to emit ultraviolet light.

15. A light emitting device, comprising:
a light emitting element including:
a semiconductor layer which includes a light emitting layer; and
a first element electrode and a second element electrode which are joined to the semiconductor layer and through which a current for causing the light emitting layer to emit light is to be supplied; and
a Si substrate provided with a cavity, the light emitting element being installed on a bottom surface of the cavity,
wherein:
the first element electrode is disposed on a surface of the semiconductor layer which faces the bottom surface of the cavity,
a slit-shaped through hole extends from the bottom surface of the cavity through the Si substrate in a thickness direction of the Si substrate, and a through electrode at least partially fills the through hole,
the through hole and the through electrode are provided at a position facing the first element electrode of the light emitting element,
a length of an upper surface of the through electrode in a long axis direction is larger than a height of the through electrode in the thickness direction of the Si substrate, and a length of the upper surface of the through electrode in a short axis direction is smaller than the height,
a joining layer having a shape corresponding to a shape of the upper surface of the through electrode is disposed between the first element electrode of the light emitting element and the upper surface of the through electrode facing the first element electrode, an entire upper surface of the through electrode is joined to the first element electrode via the joining layer, on an upper surface of an opening of the cavity, a lid member which allows light emitted by the light emitting element to pass through and closes the opening of the cavity is installed, and one of a lower surface of the lid member which closes the opening of the cavity and an upper surface of the Si substrate is provided with a recess portion, and the other of the lower surface of the lid member which closes the opening of the cavity and the upper surface of the Si substrate is provided with a projection portion configured with a plastically deformable material, and the projection portion is inserted into the recess portion and plastically deformed to fill the recess portion, and is in close contact with the recess portion.

16. The light emitting device according to claim 15, wherein an inner wall of the recess portion and the projection portion are joined by solid phase diffusion.

17. A manufacturing method of the light emitting device according to claim 1, the method comprising:
  a first etching step of forming the cavity by etching;
  a second etching step of forming the slit-shaped through hole by etching;
  a plating step of forming the through electrode by filling the through hole by plating, and forming a metal joining layer on the through electrode; and
  a mounting step of directly mounting the light emitting element on the metal joining layer.

18. The manufacturing method according to claim 17, wherein in the mounting step, by melting the metal joining layer, an electrode of the light emitting element is joined, and a gap between a through hole inner wall at an upper portion of the through hole and the through electrode is filled with a melted substance of the metal joining layer.

19. The manufacturing method according to claim 17, wherein the plating step includes:
  a step of forming the through electrode by plating from a bottom surface of the through hole to a position below an upper surface of the through hole,
  a step of forming a barrier layer by plating from an upper surface of the through electrode to a position below the upper surface of the through hole, and
  a step of forming the metal joining layer by plating from an upper surface of the barrier layer to a position above the upper surface of the through hole.

20. The manufacturing method according to claim 17, further comprising:
  a step of forming either a recess portion or a projection portion made of a plastically deformable material on a periphery of the cavity;
  a step of preparing a member to cover an opening of the cavity and forming the other of the recess portion and the projection portion made of a plastically deformable material at a position corresponding to the periphery of the cavity; and
  a step of installing the member to the opening of the cavity and press-fitting the projection portion into the recess portion to deform the projection portion and bring the projection portion into close contact with an inner wall of the recess portion for joining.

21. The manufacturing method according to claim 20, wherein in the step of bringing the projection portion and the recess portion into close contact with each other for joining, solid phase diffusion joining based on a load is performed at a room temperature or in a heating atmosphere at a temperature lower than a melting point of the metal joining layer.

22. The manufacturing method according to claim 17, wherein:
  the Si substrate is made of single crystal Si, and
  the first etching step of forming the cavity is a step of performing crystal anisotropic etching on the single crystal Si substrate with an alkaline solution.

23. The manufacturing method according to claim 17, wherein the plating step of forming the through electrode is a step of filling the through hole by electroplating.

24. The manufacturing method according to claim 20, wherein a metal forming the projection portion is Au, an Au layer is also provided on the inner wall of the recess portion, and the Au forming the projection portion and the Au layer on the inner wall of the recess portion are joined by Au—Au solid phase diffusion joining in the step of bringing the projection portion and the recess portion into close contact with each other for joining.

* * * * *